(12) United States Patent
Huang

(10) Patent No.: US 8,080,433 B2
(45) Date of Patent: Dec. 20, 2011

(54) METHOD FOR DETACHING LAYERS WITH LOW MAGNETIC PERMEABILITY

(75) Inventor: Shih-Cheng Huang, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/091,151

(22) Filed: Apr. 21, 2011

(65) Prior Publication Data
US 2011/0256643 A1  Oct. 20, 2011

Related U.S. Application Data

(62) Division of application No. 12/693,503, filed on Jan. 26, 2010, now Pat. No. 7,989,225.

(30) Foreign Application Priority Data

Aug. 18, 2009  (CN) .......................... 2009 1 0305742

(51) Int. Cl.
*H01L 21/00* (2006.01)

(52) U.S. Cl. .............. 438/3; 438/29; 438/478; 438/488; 257/E21.04

(58) Field of Classification Search ................ 438/3, 29, 438/478, 488; 257/77, 91, 96, 103, E21.01, 257/E21.04, E21.008
See application file for complete search history.

(56) References Cited

U.S. PATENT DOCUMENTS

| | | | |
|---|---|---|---|
| 6,287,882 B1 * | 9/2001 | Chang et al. | 438/29 |
| 6,794,684 B2 * | 9/2004 | Slater et al. | 257/77 |
| 7,189,626 B2 * | 3/2007 | Elkins et al. | 438/397 |

* cited by examiner

*Primary Examiner* — Charles Garber
*Assistant Examiner* — Abdulfattah Mustapha
(74) *Attorney, Agent, or Firm* — Altis Law Group, Inc.

(57) ABSTRACT

A method for detaching a first material layer from a second material layer includes following steps: forming a high-magnetic-permeability material layer on a first material layer comprised of low-magnetic-permeability material; removing a portion of the high-magnetic-permeability material layer to expose a portion of the first material layer; epitaxially growing a second material layer comprised of low-magnetic-permeability material on the exposed portion of the first material layer and the high-magnetic-permeability material layer; cooling the first and second material layers; heating the high-magnetic-permeability material layer, thus detaching the first material layer from the second material layer.

11 Claims, 21 Drawing Sheets

METHOD FOR DETACHING LAYERS WITH LOW MAGNETIC PERMEABILITY

CROSS-REFERENCE TO RELATED APPLICATION

This patent application is a divisional application of patent application Ser. No. 12/693,503, filed on Jan. 26, 2010, entitled "METHOD FOR DETACHING LAYERS WITH LOW MAGNETIC PERMEABILITY", assigned to the same assignee, which is based on and claims priority from Chinese Patent Application No. 200910305742.4, filed in China on Aug. 18, 2009, and disclosure of which is incorporated herein by reference in its entirety.

BACKGROUND

1. Field of the Invention

The present disclosure relates generally to a method for detaching material layers, and more particularly, to a method for detaching material layers of a semiconductor device.

2. Description of Related Art

A building block of many electronic devices such as diodes, transistors, and lasers is usually made of semiconductor material that can be grown over a substrate. The semiconductor material is fabricated by growing an epitaxial layer of the semiconductor material upon a substrate. For example, a light emitting diode (hereafter LED) is fabricated by growing an epitaxial layer of III-Nitride semiconductor on a sapphire substrate using a method of metal-organic chemical vapor deposition.

However, the sapphire substrate has a weak thermal conductivity, such that heat can not be dissipated efficiently out of the LED. This will reduce the light emitting efficiency of the LED. On the other hand, the sapphire substrate has a lattice parameter different from the III-Nitride semiconductor, thereby having a different expansion coefficient from the III-Nitride semiconductor. The difference of expansion coefficients may result in distortion of the sapphire substrate or the III-Nitride semiconductor when a temperature of the LED is high. Thus, the sapphire substrate is required to be detached/separated from the LED after growing epitaxial layer of III-Nitride semiconductor.

Typically, the sapphire substrate is detached from the LED by applying a method of laser lift off melt the epitaxial layer at its interface with the substrate on which is grown. However, the laser has high energy, which is absorbed by the epitaxial layer. This may break a lattice structure of the epitaxial layer, thereby resulting in quality reduction of the LED.

Therefore, there is a need in the art for method for detaching layers, which overcomes the above-mentioned problems.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

Figure 1:
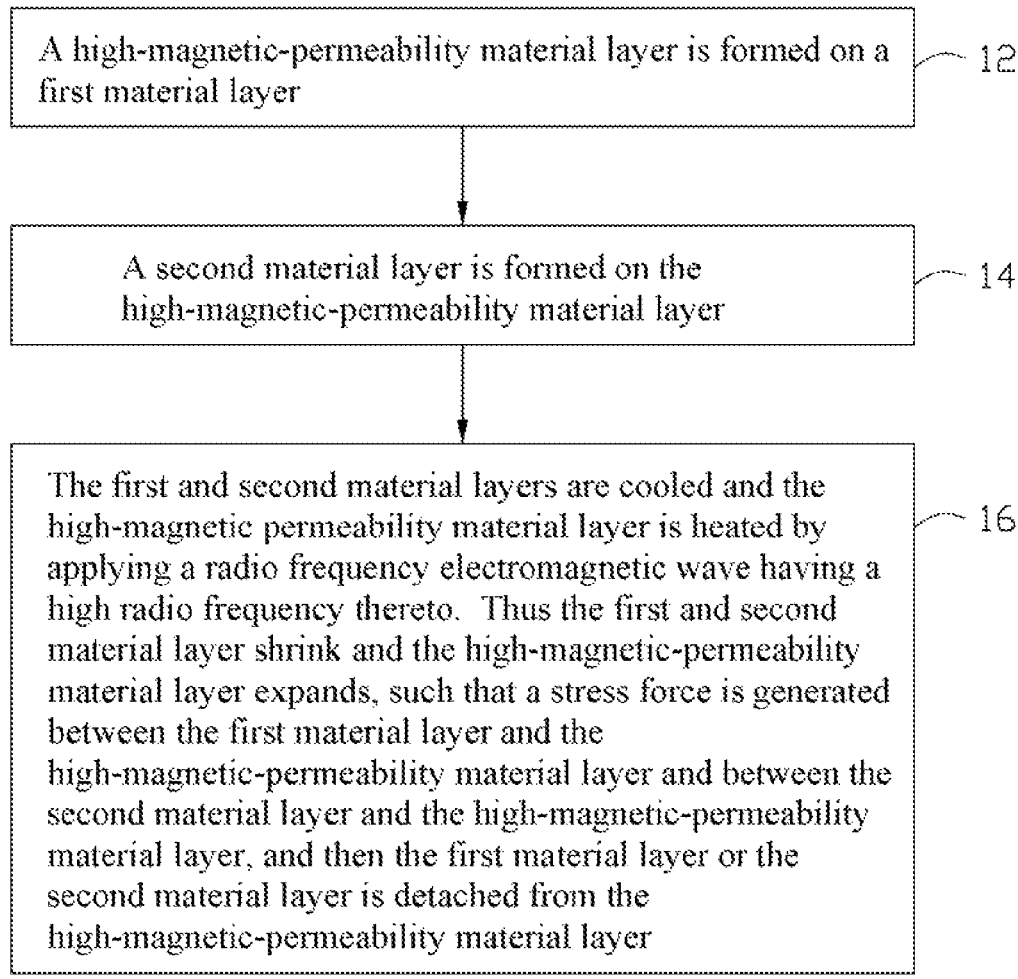
FIG. 1 is a flow chart of a method for detaching a material layer from a multilayer structure in accordance with a first exemplary embodiment.

Referring to FIG. 1, a method for detaching a material layer from a multilayer in accordance with a first exemplary embodiment is provided. In this embodiment, the method is used for detaching one semiconductor layer from another semiconductor layer, or one semiconductor layer from an insulating layer. Referring to FIG. 2, the method is described in detail as follows.

Step 12: a high-magnetic-permeability material layer is formed on a first material layer.

Figure 2A:
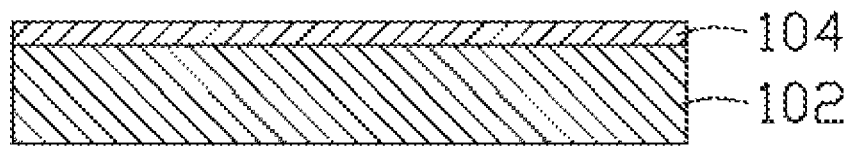
FIG. 2A-FIG. 2E are cross-sectional views illustrating successive stages of the method for detaching a layer from a multilayer structure according to an alterative embodiment

Referring to FIG. 2A, a high-magnetic-permeability material layer 104 is formed on a surface of a first material layer 102 by sputtering or vapor plating. The first material layer 102 is made of a low-magnetic-permeability material. In this embodiment, the first material layer 102 can be a semiconductor material or an insulating material.

The high-magnetic-permeability material layer 104 can be selected from the group consisting of molybdenum-metal (Mo-metal), permalloy, electrical steel, Nickel zinc ferrite, manganese zinc ferrite, steel and nickel. Generally, a magnetic permeability of the high-magnetic-permeability material layer 104 is at least $10^2$ times larger than that of the first material layer 102. For example, when the first material layer 102 is sapphire having a magnetic permeability of 1.25 $N/A^2$, the corresponding high-magnetic-permeability material layer 104 may have a magnetic permeability of equal to or more than 125 $N/A^2$. A table showing magnetic permeability values of some high-magnetic-permeability materials and the sapphire is illustrated below.

| material | Coefficient of magnetization | Magnetic ($\times 10^{-6} N/A^e$) | Magnetic field |
|---|---|---|---|
| Mo-metal | 20,000 | 25000 | at 0.002 T |
| permalloy | 8000 | 10000 | at 0.002 T |
| electrical steel ($\rho = 0.011\ \mu\Omega \cdot m$) | 4000 | 5000 | at 0.002 T |
| nickel zinc ferrite | | 20-800 | |
| manganese zinc ferrite | | >800 | |

-continued

| material | Coefficient of magnetization | Magnetic $(\times 10^{-6} N/A^e)$ | Magnetic field |
|---|---|---|---|
| steel | 700 | 875 | at 0.002 T |
| nickel | 100 | 125 | at 0.002 T |
| sapphire | $-2.1 \times 10^{-7}$ | 1.2566368 | |

Step 14: a second material layer is formed on the high-magnetic-permeability material layer.

Figure 2B:
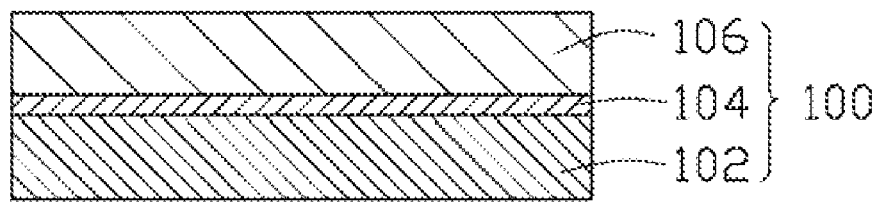

Referring to FIG. 2B, a second material layer 106 is formed on the high-magnetic-permeability material layer 104. The second material layer 106 is made of a low-magnetic-permeability material. The first material layer 102, the high-magnetic-permeability material layer 104 and the second material layer 106 cooperatively form a multilayer structure 100. Generally, a magnetic permeability of the high-magnetic-permeability material layer 104 is at least $10^2$ times larger than that of the second material layer 106. In this embodiment, the second material layer 106 can be a semiconductor material or an insulating material. In an alternative embodiment, the second material layer 106 can be the same to the first material layer 102, such that the first and second material layers 102 and 106 are gallium nitride. In another alternative embodiment, the second material layer 106 can be different from the first material layer 102, such that the first material layer 102 is sapphire and the second material layer 106 is gallium nitride.

Step 16: the first and second material layers are cooled and the high-magnetic-permeability material layer is heated by applying a radio frequency electromagnetic wave having a high radio frequency thereto. Thus, the first and second material layers shrink and the high-magnetic-permeability material layer expands, such that a stress force is generated between the first material layer and the high-magnetic-permeability material layer and between the second material layer and the high-magnetic-permeability material layer. The first material layer or the second material layer is detached from the high-magnetic-permeability material layer. That is, the first and second material layers are detached from each other.

Figure 2C:
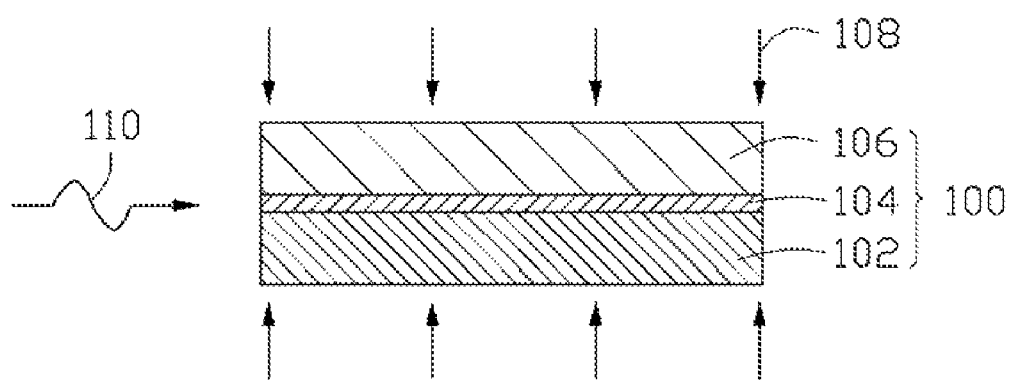

Referring to FIG. 2C, the first material layer 102 and the second material layer 106 are cooled by applying a cooling substance 108. In an alternative embodiment, the cooling substance 108 can be cooling fluid, such as liquid nitrogen, dry ice, low temperature air, low temperature water and etc. A cooling process for the first and second material layers 102 and 106 is described in detail as follows. The multilayer 100 is placed in a vacuum cavity (not shown). Then the cooling substance 108 is introduced into the vacuum cavity to cool the first and second material layers 102 and 106. Meanwhile, the high-magnetic-permeability material layer 104 is also cooled. In an alternatively embodiment, the first and second material layers 102 and 106 can also be cooled by applying a cooling device, such as one or more thermoelectric coolers. At this moment, the first material layer 102 contacts a cold end of a thermoelectric cooler, and the second material layer 106 contacts a cold end of another thermoelectric cooler.

A high-frequency radiofrequency electromagnetic wave 110 is provided. Then the multilayer structure 100 is placed in the high-frequency radiofrequency electromagnetic wave 110. A frequency of the high-frequency radiofrequency electromagnetic wave 110 is in a range from 3 gigahertz (GHz) to 300 GHz. It is well known that a high magnetic-permeability material 104 in a high-frequency radiofrequency radio field will generate a high temperature by absorbing the high-frequency radiofrequency electromagnetic wave 110. In an alternative embodiment, the high-frequency radiofrequency electromagnetic wave 110 can be generated by a wire winding, which is arranged around the multilayer 100. At this moment, temperatures of the first and second material layers 102 and 106 almost remain unchanged for the magnetic-permeability thereof is low.

Figure 2D:
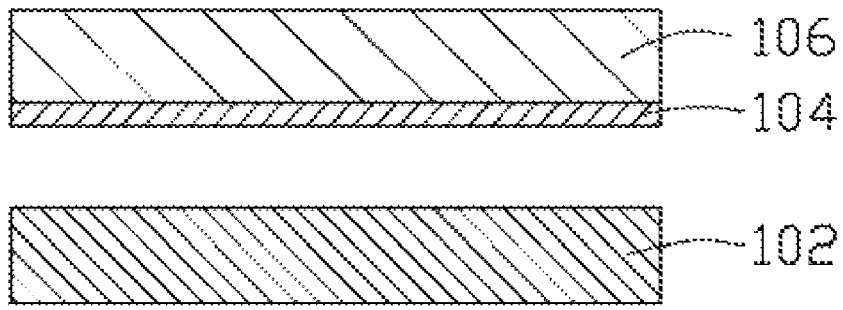
Figure 2E:
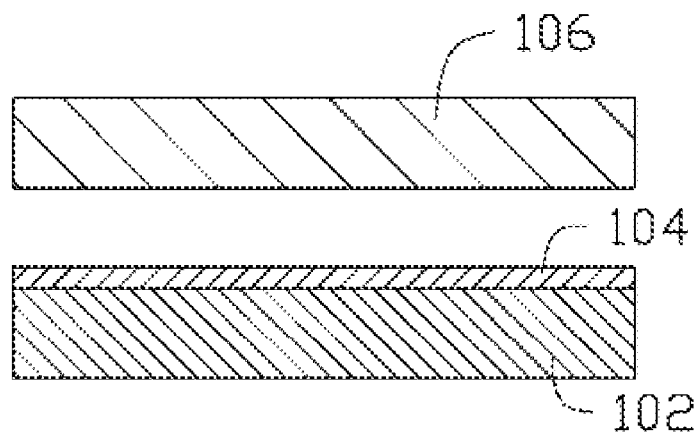

In this case, the high-magnetic-permeability material layer 104 expands according to increase in temperature, and the first and second material layers 102 and 106 shrink according to cooling by the cooling substance 108. A first stress force is generated between the first material layer 102 and the high-magnetic-permeability material layer 104, and a second stress force is generated between the second material layer 106 and the high-magnetic-permeability material layer 104. As the temperature of the high-magnetic-permeability material layer 104 increases gradually, the stress force increases correspondingly. Referring to FIG. 2D, when the temperature of the high-magnetic-permeability material layer 104 reaches a certain value, the first stress force becomes larger than a bonding force between the first material layer 102 and the high-magnetic-permeability material layer 104. At this moment, the first material layer 102 is detached from the high-magnetic-permeability material layer 104. Alternatively, referring to FIG. 2E, when the temperature of the high-magnetic-permeability material layer 104 reaches a certain value, the second stress force becomes larger than a bonding force between the second material layer 106 and the high-magnetic-permeability material layer 104. Thus the first and second material layers 102 and 106 are detached from each other.

After the first and second material layers 102 and 106 are detached from each other, a cleaning step is provided. The cleaning step including removing the high-magnetic-permeability material on the first and second material layers 102 and 106 by chemical mechanical polishing, chemical wet etching or dry etching.

Figure 3A:
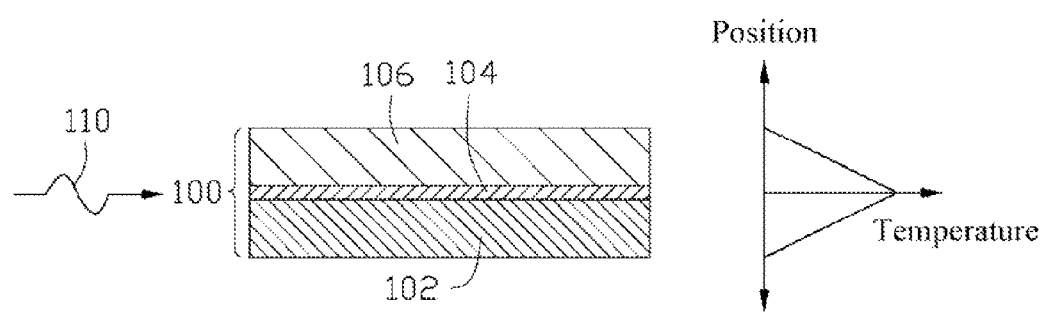
FIG. 3A-FIG. 3B are cross-sectional views illustrating temperature gradients of the multilayer structure of FIG. 2(c) without and with a cooling substance applied.
Figure 3B:
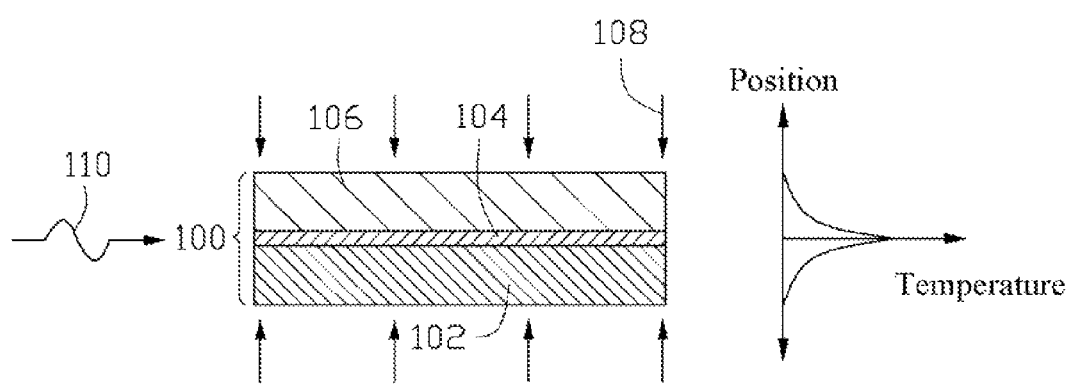

FIG. 3A-FIG. 3B illustrate temperature gradients of the multilayer structure 100 in FIG. 2C with and without the cooling substance 108 applied. In this embodiment, the temperature gradients distribute along a direction perpendicular to the first material layer 102, the second material layer 106 and the high-magnetic-permeability material layer 104. As shown in FIG. 3A, a temperature gradient of the multilayer structure 100 without the cooling substance 108 applied is shown at the right hand of the multilayer structure 100. As shown in FIG. 3B, a temperature gradient of the multilayer structure 100 with the cooling substance 108 applied is shown at the right hand of the multilayer structure 100. From the two temperature gradients as shown in FIGS. 3A and FIG. 3B, it is seen that the temperature of the multilayer structure 100 decreases gradually from a middle of the high-magnetic-permeability material layer 104 to the first and second material layers 102 and 106 respectively. The difference between FIGS. 3A and 3B is that, the temperature gradient in FIG. 3A shows two straight lines and the FIG. 3B shows two arc lines. That is, difference in temperature between the high-magnetic-permeability material layer 104 and the first and second material layer 102 and 106 with the cooling substance 108 is larger than that without the cooling substance 108. Thus, the stress force between the high-magnetic-permeability material layer 104 and the first and second material layer 102 and 106 with the cooling substance 108 is larger than that without the cooling substance 108.

Figure 4:
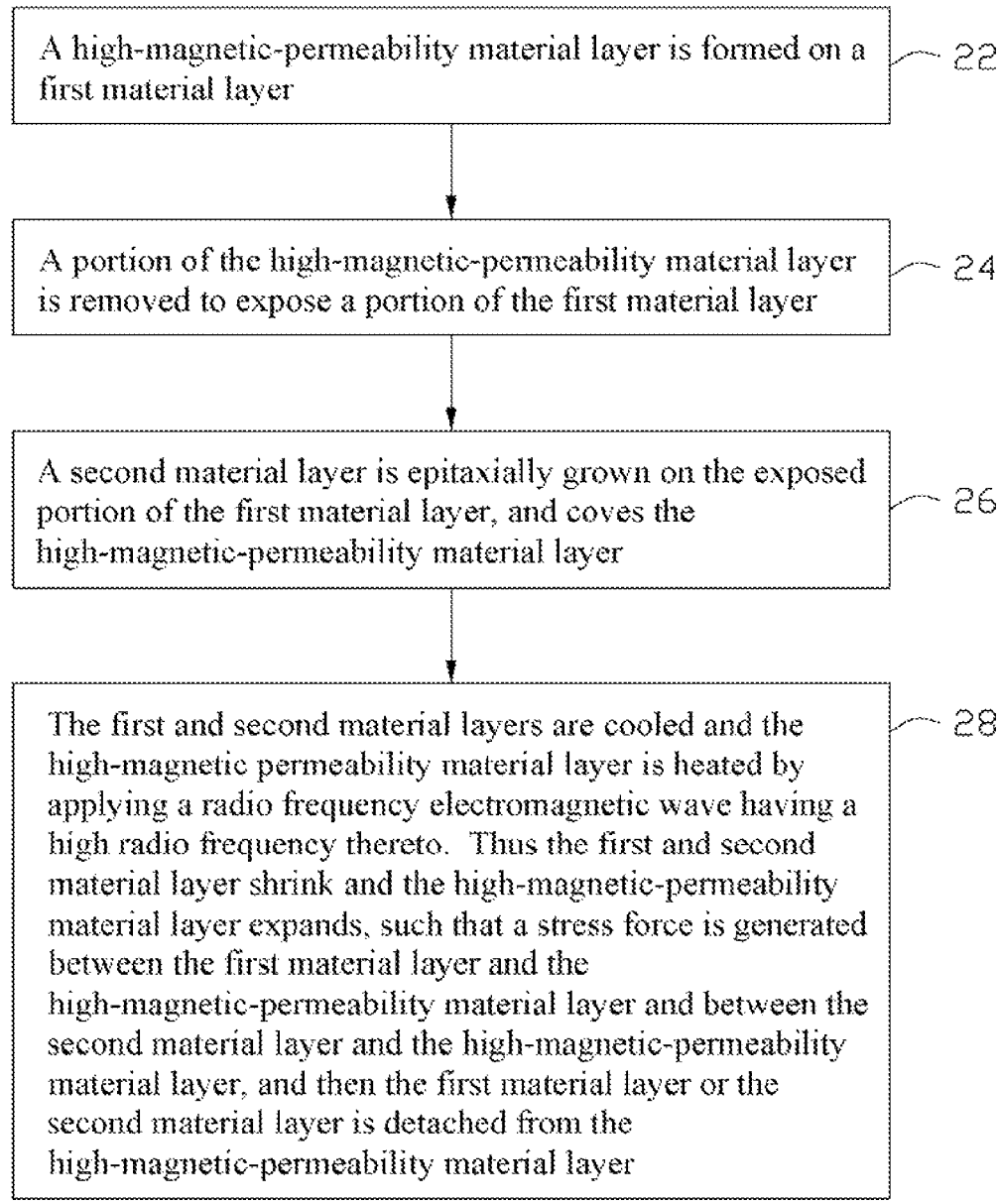
FIG. 4 is a flow chart of a method for detaching a material layer from a multilayer structure in accordance with a second exemplary embodiment.

Referring to FIG. 4, a method for detaching a material layer from a multilayer of a second exemplary embodiment is provided. In this embodiment, the method is used for detaching one semiconductor layer from another semiconductor layer, or one semiconductor layer from an insulating layer. Referring to FIG. 5A-FIG. 5F, the method is described in detail as follows.

Step 22: a high-permeability material layer is formed on a first material layer.

Figure 5A:
FIG. 5A-FIG. 5F are cross-sectional views illustrating successive stages of the method for detaching a material layer from a multilayer structure as shown in FIG. 4.

Referring to FIG. 5A, a high-permeability material layer 204 is formed on a surface of a first material layer 202 by sputtering or vapor plating. The first material layer 202 is a low-magnetic-permeability material. In an alternative embodiment, the first material layer 202 can be a semiconductor material, such as an element semiconductor or a compound semiconductor. The element semiconductor can be silicon or germanium. The compound semiconductor can be selected from the group consisting of IV-IV semiconductor, III-V semiconductor, and II-VI semiconductor. The III-V semiconductor is one of a material for forming an LED. The III-V semiconductor material can be selected from the group consisting of an AlGaInP-based material, an AlGaInN-based material, and an AlGaAs-based material. The AlGaInN-based material can be selected from the group consisting of AlN, GaN, InN, AlGaN, GaInN, AlInN, and AlGaInN. In this alternative embodiment, the first material layer 202 can be formed by liquid-phase epitaxy (LPE), vapor-phase epitaxy (VPE), metal organic chemical vapor deposition, (MOCVD) and molecular beam epitaxy (MBE). In another alternative embodiment, the first material layer 202 can also be an insulating material, such as sapphire. The high-magnetic-permeability material layer 204 has a same material to the high-magnetic-permeability material layer 104 of the first exemplary embodiment.

Step 24: a portion of the high-magnetic-permeability material layer is removed to expose a portion of the first material layer.

Figure 5B:
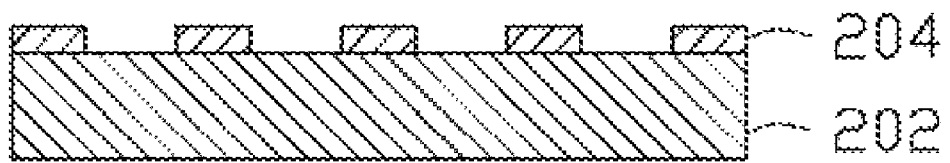

Referring to FIG. 5B, a portion of the high-magnetic-permeability material layer 204 is removed by applying a photolithography method, such that a portion of the first material layer 202 is exposed. In the illustrated embodiment, the exposed portion of the first material layer 202 forms a patterned structure as lattice structure. A reason for exposing the first material layer 202 is that the high-magnetic-permeability material layer 204 is a material not capable of epitaxial growth of a second material layer 206 in a latter step 26. Thus the second material layer 206 can be epitaxially grown on the exposed first material layer 202.

Step 26: a second material layer is epitaxially grown on the exposed portion of the first material layer, and covers the high-magnetic-permeability material layer.

Figure 5C:
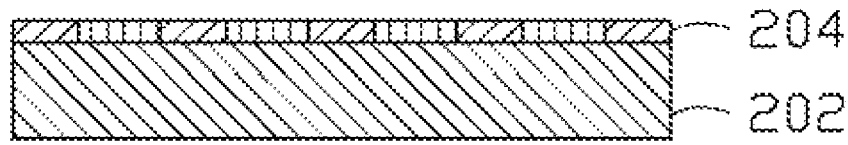
Figure 5D:
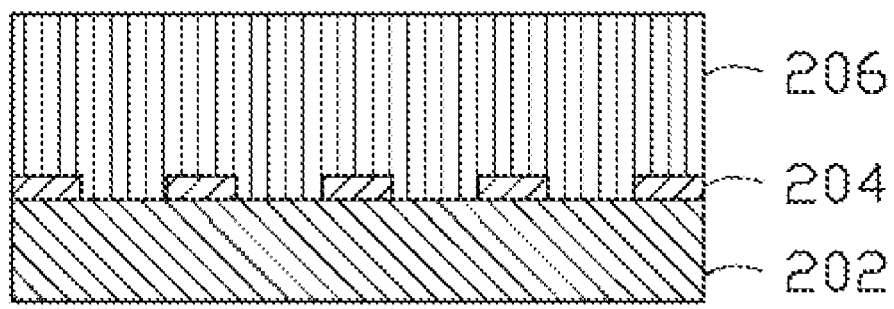

Referring to FIGS. 5C and 5D, the second material layer 206 is epitaxially grown on the exposed portion of the first material layer 202 and covers the entire surface of the high-magnetic-permeability material layer 204. The second material layer 206 can be a semiconductor material or an insulating material. A material of the second material layer 206 can be same to the first material layer 202, for example they both are GaN. The material of the second material layer 206 can also be different from that of the first material layer 202, for example the first material layer 202 is sapphire and the second material layer is GaN.

Step 28: the first and second material layers are cooled and the high-magnetic-permeability material layer is heated by applying a radio frequency electromagnetic wave having a high radio frequency thereto. Thus the first and second material layers shrink and the high-magnetic-permeability material layer expands, such that a stress force is generated between the first material layer and the high-magnetic-permeability material layer and between the second material layer and the high-magnetic-permeability material layer. The first material layer or the second material layer is detached from the high-magnetic-permeability material layer. That is, the first and second material layers are detached from each other.

Figure 5E:
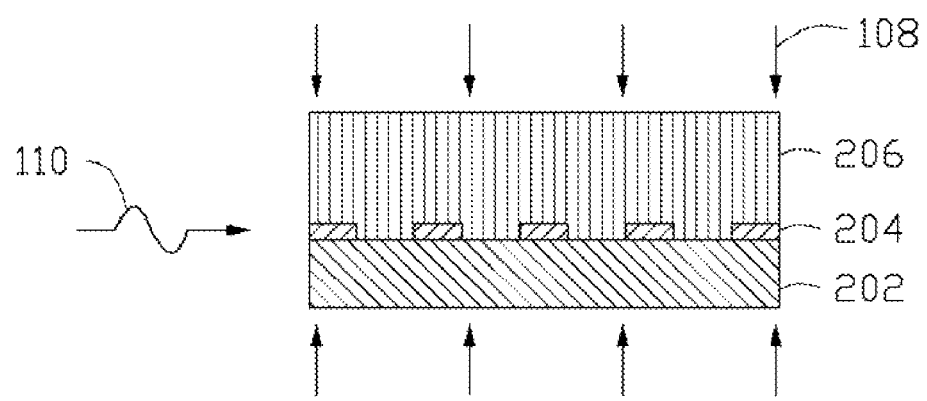
Figure 5F:
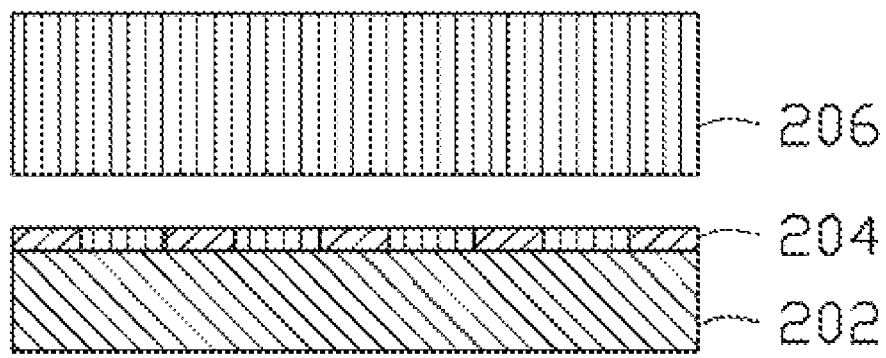

Referring to FIGS. 5E and 5F, a cooling method for the first and second material layers 202 and 206 is similar to the cooling method as described in the first exemplary embodiment, and the heating method for the high-magnetic-permeability material layer 204 by applying high-frequency radiofrequency electromagnetic wave 108 is similar to the heating method of the first exemplary embodiment. For the same reason to the first exemplary embodiment, the first material layer 202 or the second material layer 206 is detached from the high-magnetic-permeability material layer 204. As shown in FIG. 5F, in this embodiment, the first material layer 202 is detached form the high-magnetic-permeability material layer 204.

After the first and second material layers 202 and 206 are detached from each other, a cleaning step is provided. The cleaning step including removing the high-magnetic-permeability material on the first and second material layers 202 and 206 by chemical mechanical polishing, chemical wet etching or dry etching.

Figure 6A:
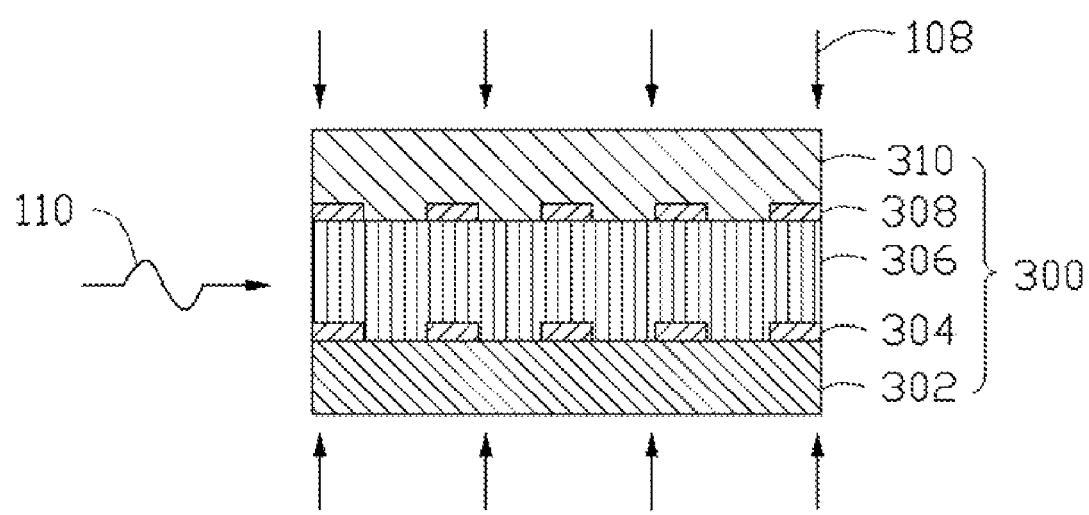
FIGS. 6A and 6B are cross-sectional views illustrating successive stages of a method for detaching a material layer from a multilayer structure in accordance with a third exemplary embodiment.
Figure 6B:
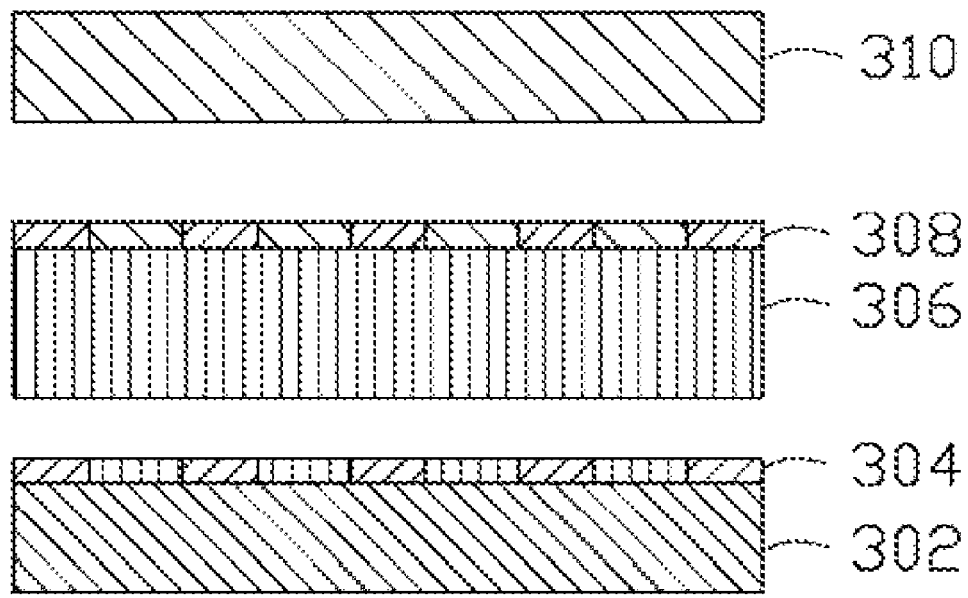

Referring to FIGS. 6A and 6B, a method for detaching two layers of a multilayer structure in accordance with a third exemplary embodiment is provided. The method is similar to the method of second exemplary embodiment. The method of this embodiment differs from the method of second exemplary embodiment is described as follows. A multilayer 300 of this embodiment includes three semiconductor layers 302, 306 and 310 stacked one after another in the above order. A first high-magnetic-permeability material layer 304 is arranged between the semiconductor layers 302 and 306, and a second high-magnetic-permeability material layer 308 is arranged between the semiconductor layers 306 and 310. The first and second high-magnetic-permeability material layers 304 and 308 each have a patterned structure to exposed semiconductors 302 and 306, such that the semiconductor layer 306 epitaxially grown on an exposed portion of the semiconductor layer 302 and the semiconductor layer 310 epitaxially grown on a exposed portion of the semiconductor layer 306. Similar to the second exemplary embodiment, the semiconductor layers 302, 306 and 310 are cooled by the cooling substance 108, and the high-magnetic-permeability material layers 304 and 310 are heated by the high-frequency radiofrequency electromagnetic wave 110, such that the semiconductor layers 302, 306 and 310 are detached from each other.

After the semiconductor layers 302, 306 and 310 are detached from each other, a cleaning step is provided. The cleaning step including removing the high-magnetic-permeability materials on the semiconductor layers 302, 306 and 310 by chemical mechanical polishing, chemical wet etching or dry etching.

Figure 7A:
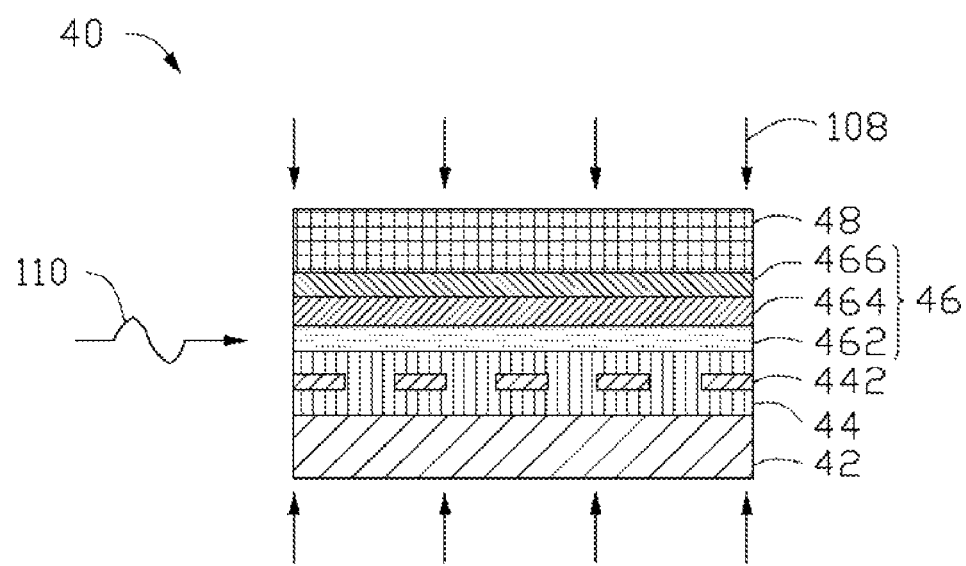
FIG. 7A-FIG.7C are cross-sectional views illustrating successive stages of a method for detaching a material layer from a multilayer structure in accordance with a fourth exemplary embodiment.
Figure 7B:
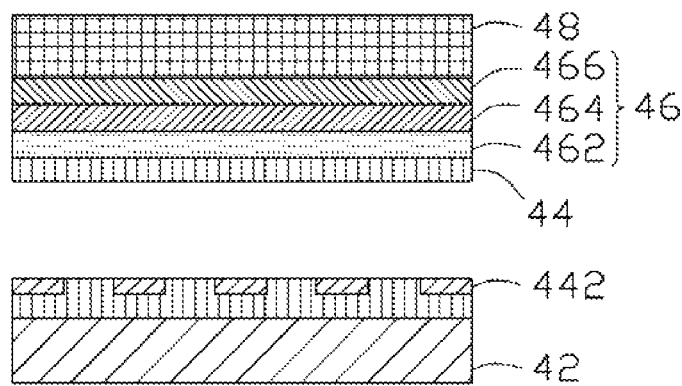
Figure 7C:
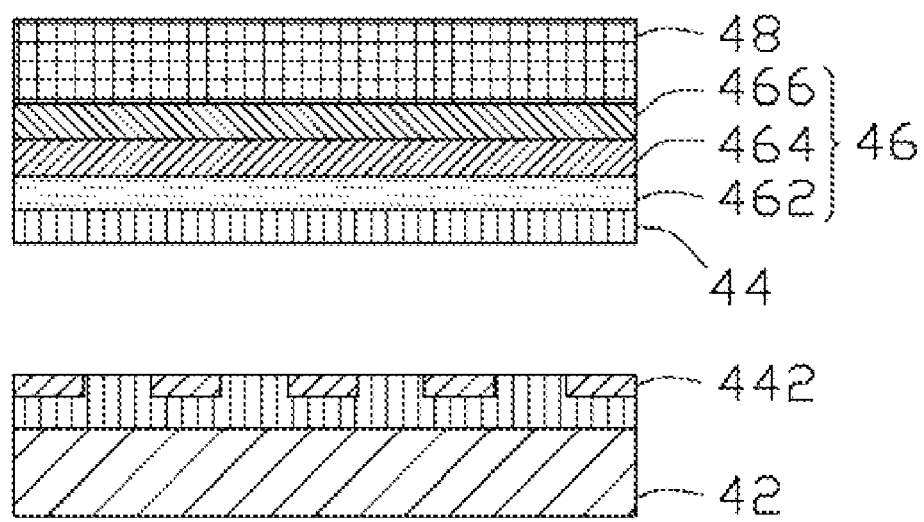

Referring to FIG. 7A-FIG. 7C, a method for detaching a layer from a multilayer structure in accordance with a fourth exemplary embodiment is provided. In this embodiment, the method is used for detaching two layers with a same material. This method is similar to the method of the second exemplary embodiment. A multilayer structure of this embodiment is an LED 40. This method is used for detaching a sapphire substrate 42 from the LED 40. The LED 40 includes the sapphire substrate 42, a GaN buffer layer 44, a functional structure 46 and a metal substrate 48 stacked one after another in the above order. The functional structure 46 includes an N-type GaN layer 462, a multi-quantum well layer 464 and a P-type GaN layer 466. A high-magnetic-permeability material layer 442 is formed in the GaN buffer layer 44. The high-magneticpermeability material layer 442 includes a patterned structure, such that the GaN buffer layer 44 includes two layers partly partitioned by the high-magnetic-permeability material layer 442 and forming a single body.

The cooling method for the GaN buffer layer 44 is similar to the cooling method as described in the first exemplary embodiment, and the heating method for the high-magnetic-permeability material layer 442 by applying high-frequency radiofrequency electromagnetic wave 108 is similar to the heating method of the first exemplary embodiment. For the same reason to the first exemplary embodiment, the two layers of the GaN buffer layer 44 are detached from each other. That is, the sapphire substrate 42 is detached from the LED 40.

Figure 8A:
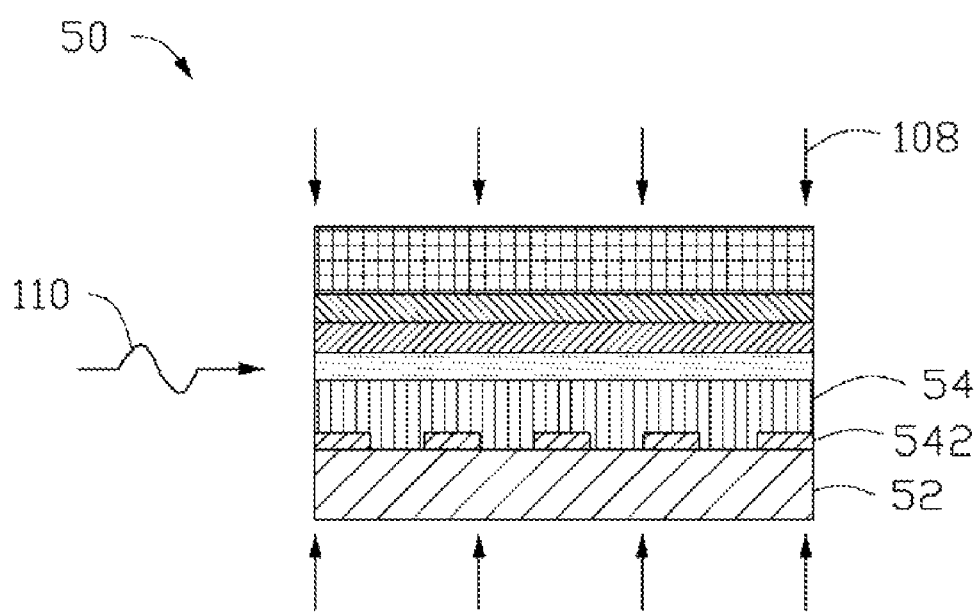
FIGS. 8A and 8B cross-sectional views illustrating successive stages of a method for detaching a material layer from a multilayer structure in accordance with a fifth exemplary embodiment.
Figure 8B:
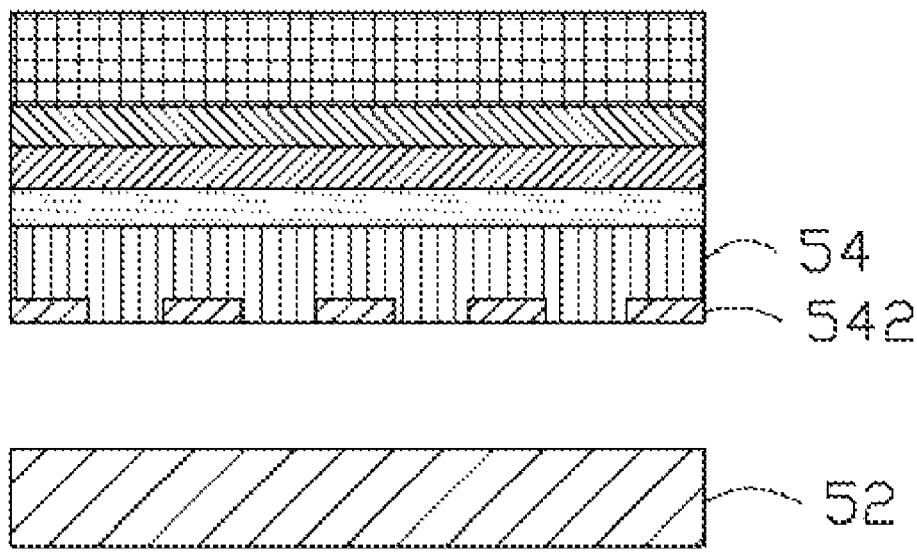

Referring to FIGS. 8A and 8B, a method for detaching a layer from a multilayer structure in accordance with a fifth exemplary embodiment is provided. In this embodiment, materials of the two detached layers are different. In the illustrated embodiment, the method is used for detaching a sapphire substrate 52 from an LED 50. The LED 50 is similar to the LED 40 of the fourth embodiment and the difference is that a high-magnetic-permeability material layer 542 is arranged between the substrate 52 and a GaN buffer layer 54. Similar to the method of the fourth exemplary embodiment, a cooling method for the GaN buffer layer 54 and the sapphire substrate 52 and a heating method for the high-magnetic-permeability material layer 542 are applied, such that the sapphire substrate 52 is detached form the LED 50.

The above methods for detaching a layer from a multilayer structure apply a cooling substance to cool the low-magnetic-permeability material layers and apply a high-frequency radio frequency electromagnetic wave to heat the high-magnetic-permeability material layer sandwiched between the low-magnetic-permeability material layers, and thus the low-magnetic-permeability material layers are detached from each other because of the stress force. This can prevent from breaking the lattice structure of the low-magnetic-permeability material layers.

It can be understood that the above-described embodiment are intended to illustrate rather than limit the disclosure. Variations may be made to the embodiments and methods without departing from the spirit of the disclosure. Accordingly, it is appropriate that the appended claims be construed broadly and in a manner consistent with the scope of the disclosure.

What is claimed is:

1. A method for detaching a first material layer from a second material layer, comprising:
    forming a high-magnetic-permeability material layer on the first material layer;
    removing a portion of the high-magnetic-permeability material layer to expose a portion of the first material layer;
    epitaxially growing the second material layer on the exposed portion of the first material layer, the second material layer covering the high-magnetic-permeability material layer, wherein the first and second material layers are comprised of low-magnetic-permeability materials;
    cooling the first and second material layers such that the first and second material layers shrink; and
    heating the high-magnetic-permeability material layer using a high-frequency radiofrequency electromagnetic wave such that the high-magnetic-permeability material layer expands, thus detaching the first material layer from the second material layer.

2. The method of claim 1, wherein a material of each of the first and second material layers is a semiconductor material or an electrically insulating material.

3. The method of claim 2, wherein the first material layer and the second material layer are comprised of a same material.

4. The method of claim 2, wherein the material of the first material layer is different from that of the second material layer.

5. The method of claim 2, wherein the semiconductor material is selected from the group consisting of an IV-IV semiconductor, an III-V semiconductor, and an II-VI semiconductor, wherein the III-V semiconductor material is selected from the group consisting of an AlGaInP-based material, an AlGaInN-based material, and an AlGaAs-based material.

6. The method of claim 2, wherein a frequency of the high-frequency radiofrequency electromagnetic wave is in a range from 3 GHz to 300 GHz.

7. The method of claim 2, wherein a material of the high-magnetic-permeability material layer is selected from the group consisting of molybdenum-metal, permalloy, electrical steel, nickel zinc ferrite, manganese zinc ferrite, steel and nickel.

8. The method of claim 2, wherein the first and second material layers are cooled using a cooling fluid.

9. The method of claim 8, wherein the cooling fluid is selected from the group consisting of liquid nitrogen, dry ice, low temperature air, and low temperature water.

10. The method of claim 2, wherein the first and second material layers are cooled using a thermoelectric cooler.

11. The method of claim 1, wherein the first material layer is sapphire.

* * * * *